United States Patent [19]

Tsukada et al.

[11] 4,101,364

[45] Jul. 18, 1978

[54] METHOD OF AN APPARATUS FOR PRODUCING FILM-LAMINATED BASE PLATES

[75] Inventors: Katsushige Tsukada; Nobuyuki Hayashi; Hideo Yamada; Toshiaki Ishimaru; Asao Isobe; Tadazi Sato, all of Hitachi, Japan

[73] Assignee: Hitachi Chemical Company, Ltd., Tokyo, Japan

[21] Appl. No.: 709,400

[22] Filed: Jul. 28, 1976

[30] Foreign Application Priority Data

Jul. 30, 1975 [JP] Japan .................................. 50-92963

[51] Int. Cl.² ............................................. B29C 17/00
[52] U.S. Cl. ...................................... 156/286; 156/382
[58] Field of Search ............... 156/286, 382, 104, 285; 34/242, 92

[56] References Cited

U.S. PATENT DOCUMENTS

| | | | |
|---|---|---|---|
| 2,993,824 | 7/1961 | Richaudeau | 156/285 |
| 3,305,416 | 2/1967 | Kahan et al. | 156/286 X |
| 3,329,549 | 7/1967 | Vilutis | 156/286 X |
| 3,545,363 | 12/1970 | Bricher et al. | 34/242 X |
| 3,640,543 | 2/1972 | Main | 34/242 X |

Primary Examiner—David Klein
Assistant Examiner—William H. Thrower
Attorney, Agent, or Firm—Birch, Stewart, Kolasch & Birch

[57] ABSTRACT

It is herein proposed to laminate a film onto a convex-concaved solid surface in a vacuum to accomplish tight contact between the film and the solid surface. The apparatus includes an air tight housing in which lamination press rolls are arranged, wherein feeding-in and feeding-out of materials such as a base plate and a film for lamination are effected through air tight roll assemblies incorporated in the wall structure of the air tight housing.

14 Claims, 8 Drawing Figures

METHOD OF AN APPARATUS FOR PRODUCING FILM-LAMINATED BASE PLATES

BACKGROUND OF THE INVENTION

1. Field of the Invention

The present invention relates to a method of producing a film-laminated base plate and an apparatus for laminating a base plate with a film layer in a continuous process under a vacuum.

2. Description of the Prior Art

Conventionally, in the process of applying a film such as a filmy photosensitive material layer on a convex-concave surface of a base plate, such as a printed wiring board, there has been a problem that unavoidable clearance spaces remained between the base plate and the film layer. This defect appears to be inherent to the conventional process which is performed under atmospheric pressure. When a film layer is laid on a convex-concave surface such as that of a printed wiring board which has relatively deep circuit relief portions in a high density, the conventional heating and pressurizing lamination method inevitably causes entrainment of air between the joining surfaces resulting in an insufficient contact in the surfaces of the relief portions. The inventors have found that the abovementioned problem is solved by performing the lamination process under a vacuum.

SUMMARY OF THE INVENTION

Therefore, it is the object of the present invention to provide a method of producing a film-laminated base plate free of air or other gases entrained therein and a continuously operable apparatus for laminating a film over a base plate under a vacuum.

According to the present invention, it is proposed that a film is heated and pressed onto a base plate under a vacuum of 200 mmHg or less in the lamination process. The film so herein referred is a polyester film, filmy photosensitive material or the like. The filmy photosensitive material has, for example, a laminated structure as shown in FIG. 1, wherein 1 is a layer of a photosensitive material which is sandwiched between a flexible supporting sheet 2 and a protective film 3. The protective film may be omitted. The thickness of the photosensitive layer is generally 30–160 microns.

The base plate which can be processed by the present invention includes copper-clad laminated plates, plates formed with relief portions, roughened copper plates having no relief portions, metal plates having convex-concave surfaces, printed wiring boards or the like.

The photosensitive resin to form the filmy photosensitive layer should preferably have resistance against heat, solvent and chemicals and electrical insulation, these characteristics being those required for the solder resist. Furthermore, the photosensitive resin must form a film at room temperature and be chemically stable in the lamination process performed under application of heat and pressure while it is further required that the resin shows adhesivity to the solid surface on which it is attached. Some examples of such a photosensitive resin favorably usable for the solder resist are given in Japanese Patent Applications 80345/73, 105064/73, 5111/74, 5112/74 and 5113/74. The compositions given in these applications include:

(A) Photo-polymerizable unsaturated compounds having at least two terminal ethylene radicals,
(B) Sensitizer for initiating polymerization of said unsaturated compounds by actinic radiation,
(C) Linear high molecular compounds having photo or thermoreactive radicals in side chains,
(D) Compounds having at least two epoxy radicals and,
(E) Curing agents for epoxy compounds whereby the compositions provide a superior resist when they have been processed by exposure to light, development and heating.

Furthermore, a composition including, (A) Photo-polymerizable unsaturated compounds having at least two terminal ethylene radicals,
(B) Sensitizers for initiating polymerization of said unsaturated compounds by actinic radiation, and
(C) Linear high molecular compounds having tetrahydrofurfuryl radicals and carboxyl radicals in side chains is also usable.

The present invention is not limited to the abovementioned photosensitive resins but other photosensitive resins may also be employed. Favorable thickness of the photosensitive layer differs according to not only characteristics required for the protective film or resist film but also the shape of convex-concave manner of the solid surface on which the photosensitive layer is applied, such as thickness and density of the circuit in the case of a printed wiring board. When the level difference between concave and convex surfaces is large with a high density thereof, a thicker photosensitive layer is generally required. For the solder resist, a thickness between 30–160 microns is generally suitable.

Any conventional method can be employed to form a photosensitive layer on a flexible supporting sheet. According to a common process, a photosensitive resin is uniformly disolved in an organic solvent such as methylethylketone, toluene or the like and the solution is applied onto the flexible supporting sheet by the knife coat method, roller coat method, etc., the coat layer being drive thereafter. It is preferable that solvent residual in the photosensitive layer is less than 1 weight percent.

The flexible supporting sheet employed in the present invention must be sufficiently resistive to heat and solvent as required in the manufacturing process of the photosensitive material and also be transparent. Furthermore, it is required that adhesion between the supporting sheet and the photosensitive layer is made weaker than that between the photosensitive layer and a base plate such as a printed wiring board after the photosensitive layer has been exposed to light. Favorable examples of the flexible supporting sheet are polyester, polyamide films or the like. These supporting sheets can be readily removed from the photosensitive layer formed on the printed wiring boards. Thickness of the flexible supporting sheet is not particularly specified but it should preferably be 20–40 microns in view of operational convenience and the cost in forming the photosensitive layer on the supporting sheet.

According to the present invention, the process of laminating films on base plates is performed in a vacuum lower than 200 mmHg, preferably 60 mmHg. The vacuum level is varied according to the kind of photosensitive material forming the photosensitive layer (especially thickness of the layer and fluidity of the layer under heating) degree of heating and pressurization during lamination and level difference and density of convex and concave portions in a solid surface onto which the photosensitive layer is applied. In spite of these conditions, it is less than 200 mmHg, preferably 60 mmHg vacuum that the evacuation of atmosphere provides a noticable effect. Heating in the lamination process should preferably maintain a temperature between 50°–160° C which softens the resin without deteriorating same. It is recommended that the photosensitive material is preheated prior to lamination and pressing and that the solid surface on which lamination is applied is also preheated.

Lamination under a vacuum can be performed by placing a conventional laminator such as A-24 laminator manufactured by E. I. du Pont de Nemours and Company in a vacuum vessel, said laminator being commonly used to laminate a filmy photosensitive material for etching to form a circuit or a plating resist onto a copper-coated plate, charging a photosensitive material and a base plate in the laminator, evacuating the vacuum, lamination chamber, and operating the laminator so that the base plate with said photosensitive material laid thereover is passed through the lamination rolls.

However, in order to facilitate the lamination process to be performed under a vacuum, it is another object of the present invention to provide a continuously operable lamination apparatus which comprises an evacuation device for evacuating the inside of the apparatus, a film feeder provided in the apparatus, at least one set of base plate feed-in rolls for feeding a base plate from the outside to the inside of the apparatus, at least one set of press rolls for laminating a film onto the base plate, at least one set of laminated plate feed-out rolls for feeding out a laminated plate from the inside to the outside of the apparatus, said base plate feed-in rolls and said laminated plate feed-out rolls being in sliding contact with rubber linings incorporated within a wall structure for the apparatus to maintain air tightness of the inside of the apparatus, and a driving mechanism engaging at least one of the aforementioned rolls.

According to another aspect of the invention, it provides a continuously operable lamination apparatus comprising an evacuation device for evacuating the inside of the apparatus, at least one set of film feed-in rolls for feeding a film from the outside to the inside of the apparatus, at least one set of plate feed-in rolls for feeding a base plate from the outside to the inside of the apparatus, at least one set of press rolls for laminating the film onto the base plate, at least one set of laminated plate feed-out rolls for feeding out the laminated plate from the inside to the outside of the apparatus, said film feed-in rolls, said base plate feed-in rolls and said laminated plate feed-out rolls being in sliding contact with rubber linings incorporated in a wall structure of the apparatus to maintain air tightness of the inside of the apparatus, and a driving mechanism engaging at least one of the aforementioned rolls.

Particularly important mechanisms in the apparatus of the invention are:

(1) An evacuation device for evacuating the intake of the apparatus, (2) A lamination device for producing a laminated plate, said device including;

(a) at lease one set of lamination rolls for laminating and pressing together a film and a base plate to produce laminated plate within the apparatus;

(b) at least one set of base plate feed-in rolls for feeding the base plate from the outside to the inside of the apparatus, said rolls being in sliding contact with a wall structure of the apparatus, and;

(c) at least one set of laminated plate feed-out rolls for feeding out the laminated plate composed of the film and the base plate which are pressed together through said press rolls from the inside to the outside of the apparatus, said rolls being in sliding contact with the wall structure of the apparatus, and;

(3) A driving mechanism engaging at least one of the aforementioned rolls.

These devices and mechanisms are operatively assembled to feed the base plate through said base plate feed-in rolls into the internal space of the apparatus evacuated by said evacuation device, to laminate a film onto the base plate by said press rolls and to feed out the laminated plate through said laminated plate feed-out rolls from the inside to the outside of the apparatus. In the assembly, at least one of said base plate feed-in rolls, laminated plate feed-out rolls and press rolls is engaged with said driving mechanism. It is favorable that the base plate feed-in rolls and the laminated plate feed-out rolls are directly engaged with the driving mechanism but they may be indirectly driven by the driving mechanism by way of other rolls which are directly driven by the driving mechanism.

When the film feeding device is not provided at the inside of the apparatus, at least one set of film feed-in rolls for feeding in a film from the outside to the inside of the apparatus is required.

When the film carries a protective film, a set of protective film takeup rolls is provided at the inside of the apparatus or at least one set of protective film takeout rolls are provided to take out the protective film from the inside to the outside of the apparatus, said rolls being mounted in sliding contact with the wall structure of the apparatus to maintain air tightness of the inside of the apparatus.

The aforementioned rolls such as the base plate feed-in rolls, the laminated plate feed-out rolls, the film feed-in rolls and the optionally provided protective film feed-out rolls are provided with rubber linings. The hardness of the rubber linings should preferably be from 15° by Shore A to 70° by Shore D, particularly from 30° to 70° by Shore A. The thicknes of the linings should preferably be 1–60 mm, particularly 5–30 mm. If the rubber is harder than 70° by Shore D, it is so hard that when the base plate, laminated plate, film or protective film (referred to base plate, etc., hereinunder) pass through the rolls, clearances are formed at both sides of the base plate, etc., thereby breaking air tightness of the apparatus. On the contrary, if the rubber is softer than 15° by Shore A, it will be too soft to effectively maintain a vacuum within the apparatus. If the rubber linings are thicker than 50 mm, they cannot effectively maintain a vacuum in the apparatus, while linings thinner than 1 mm cause clearances at both sides of the base plate, etc.

Other objects and further scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 1:
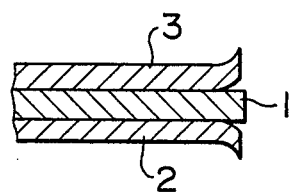
FIG. 1 is a sectional view of a filmy photosensitive material used in the present invention.
Figure 2:
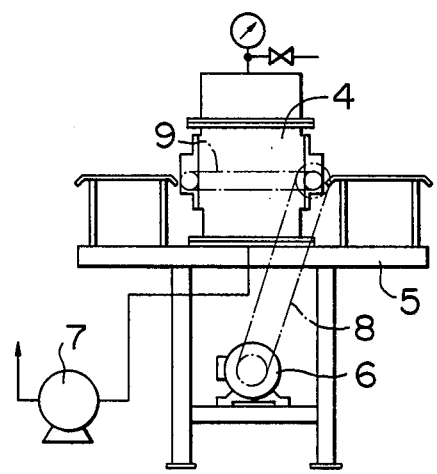
FIG. 2 is a side view of an embodiment of the continuously operable lamination apparatus of the present invention.
Figure 3:
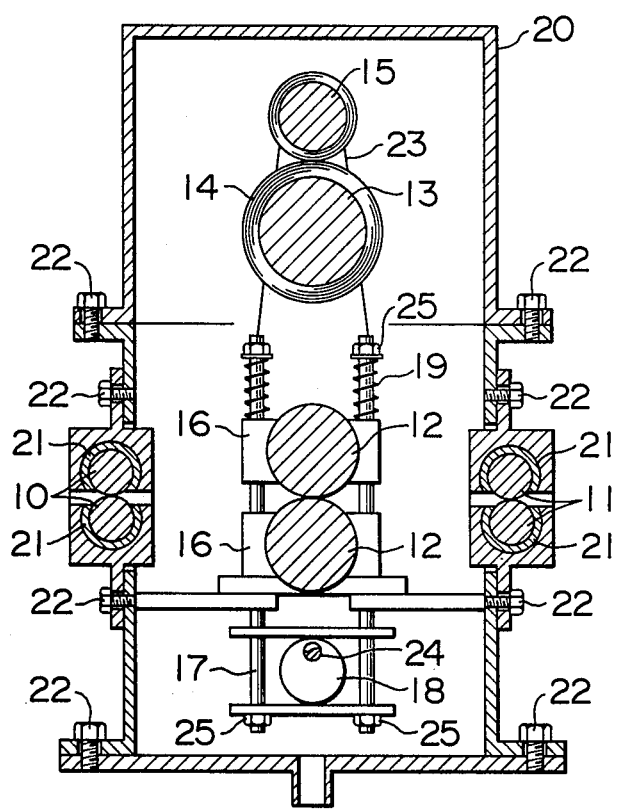
FIG. 3 is a vertical sectional view of an embodiment of a lamination device of the present invention including a film supply device located at the inside of the device.

Turning now to FIG. 2 showing an embodiment of the apparatus of the present invention, it includes a lamination chamber device 4, a stand frame 5, a driving mechanism 6 and an evacuation device 7. The lamination device 4 is housed in an air-tight casing, the inside of which is evacuated by the evacuation device 7. The driving mechanism 6 engages the base plate feed-in rolls incorporated in the lamination device 4 by way of an endless chain or belt 8. The base plate feed-in rolls and the laminated plate feed-out rolls in the lamination device are interconnected with each other by an endless chain or belt 9. FIG. 3 shows the lamination chamber device 4 in a vertical section. As shown in the FIG. 3, the lamination device includes base plate feed-in rolls 10, laminated plate feed-out rolls 11 and press rolls 12. A film feed roll 13 carries a film 14 wound therearound. When the film 14 carries a protective film, the protective film is wound up by a protective film takeup roll 15. A base plate is fed into the inside of the device by base plate feed-in rolls 10 and passed through the press rolls 12 where it is laminated with the film 14 supplied from the film supply roll 13. The laminated plate thus produced is fed out of the apparatus by the laminated plate feed-out rolls 11. In the shown embodiment, the bearings 16 for the press rolls 12 are guided by guide rods 17 which are selectively driven downward by a cam 18. When the guide rods 17 are driven downward, the upper press roll is urged against the lower press roll under the spring force exerted by springs 19. The base plate feed-in rolls 10 and the laminated feed-out rolls 11 are in sliding contact with the wall 20 of the casing via sliding elements 21 incorporated in the wall structure. The sliding elements or linings 21 have a smaller inner diameter than the other diameter of the base plate feed-in rolls 10 or the laminated plate feedout rolls 11, wherein the difference in diameter is compensated by elastic expansion and contraction of the rubber linings of the rolls, thereby ensuring air tightnesss of the inside of the wall structure 20. The inner diameter of the sliding elements 21 is made 0.3–0.5 mm smaller than the outer diameter of the rolls 10 or 11. The sliding elements 21 are made of carbon, carbon tetrafluoride resin or the like to effect a smooth sliding contact between the rolls and the sliding elements. The driving mechanism 6 may engage at least one of the base plate feed-in rolls 10, the laminated plate feed-out rolls 11 and the press rolls 12. Or alternatively, all of the rolls may individually be engaged with the driving mechanism. When the driving mechanism engages only one of the rolls, the individual rolls are interconnected by chains or belts. The casing or wall structure 20 may be composed of several components which are clamped together by bolts 22. When the film carries a protective film, the protective film is taken up by the protective film takeup roll 15. In FIG. 3, numerals 23, 24 and 25 designate a support member, a cam shaft and nuts, respectively.

Figure 4:
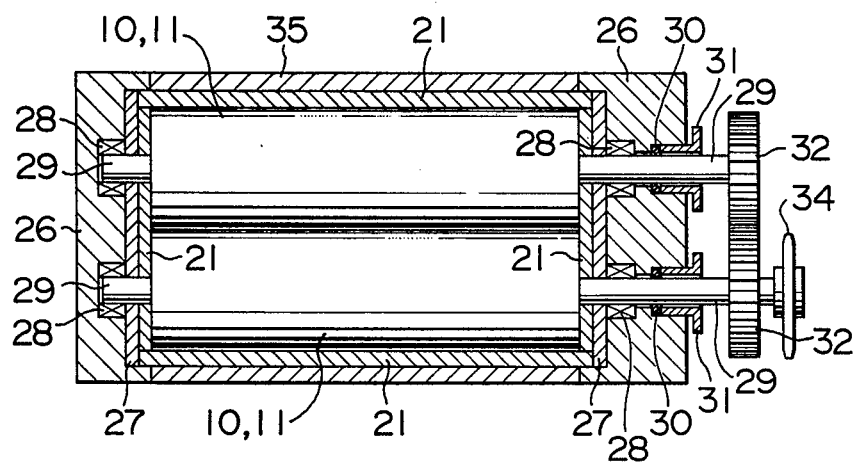
FIG. 4 is an axial sectional view of a set of base plate feed-in rolls or a set of laminated plate feed-out rolls and their surroundings.

FIG. 4 is an axial sectional view of the base plate feed-in rolls 10 or laminated plate feed-out rolls 11 and the sliding elements 21. As shown in the FIG. 4, the rolls 10 or 11 and the sliding elements 21 are in sliding contact with each other at their peripheral portions as well as opposite end portions. Cushion members 27 made of rubber or the like are disposed between end sliding elements and side covers 26. Bearings 28 are disposed between the side covers 26 and shaft 29 of the rolls 10 or 11. O-rings 30 are mounted around the shaft 29 under compression applied by O-ring retainers 31 thereby providing seal structures for the shaft 29. The two rollers are interconnected by gears 32, one of which is driven via a sprocket 34 which is driven by the driving mechanism 6 by way of the chain 8. When other rolls are driven by way of the rolls 10 or 11, other sprockets are provided on the shaft 29.

Figure 5:
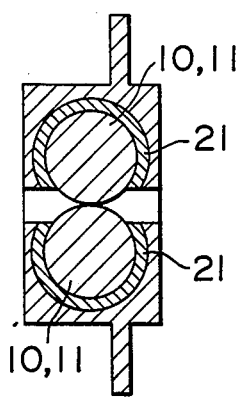
FIG. 5 is a cross-sectional view of the base plate feed-in rolls or the laminated plate feed-out rolls and their surroundings.
Figure 6:
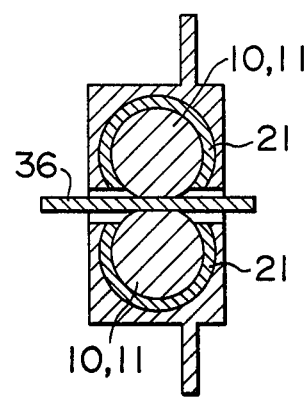
FIG. 6 is a view similar to FIG. 5, showing the manner of feeding a base plate therethrough.
Figure 7:
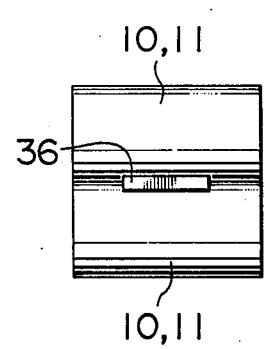
FIG. 7 is a side view of the base plate feed-in rolls feeding a base plate therethrough; and, FIG. 8 is a vertical sectional view of another embodiment of the lamination device of the present invention not including a film supply device at the inside of the device.

FIG. 5 is a cross sectional view of the base plate feed-in rolls 10 or the laminated plate feed-out rolls 11 and the surrounding structure. FIGS. 6 and 7 are a cross-sectional view and a front view, respectively, of the base plate feed-in rolls 10 or the laminated plate feed-out rolls 11 and the surrounding structure showing the manner of feeding the base plate or the laminated plate therethrough. As shown in the figures, the plate and the rolls tightly contact with one another while the plate is fed through the rolls thereby maintaining air tightness of the wall structure of the apparatus.

Figure 8:
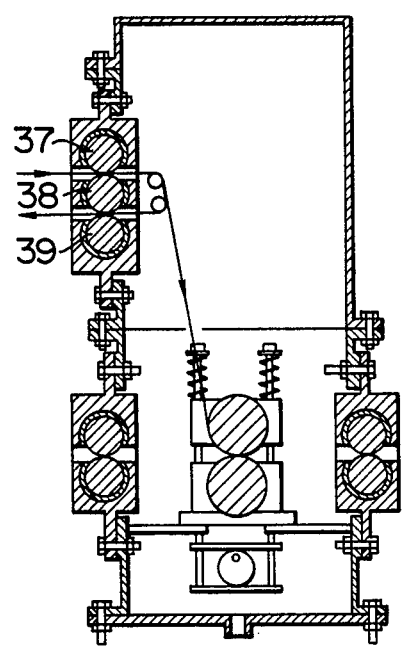

FIG. 8 is a sectional view of another embodiment of the lamination device which does not include a film supply device mounted at the inside of the apparatus. This embodiment includes a 3-roll assembly including rolls 37, 38 and 39 each being in sliding contact with rubber linings of a similar structure as those of the base plate feed-in rolls and the laminated plate feed-out rolls. The film is fed in through between the rolls 37 and 38 and, when the film carries a protective film, the protective film is taken out through between the rolls 38 and 39. These three rolls are interconnected by a gear train to make synchronized rotation and are directly driven by the driving mechanism by way of a chain or belt or indirectly driven by the driving mechanism by way of other rolls and chains or belts. The roll 39 may be omitted when the film carries no protective film or the protective film is removed before the film is fed into the lamination device. The other structures of the device are similar to those in the first embodiment. When the film supply device is not mounted within the casing of the lamination device, the capacity of a film source roll is not restricted by a particular condition, whereby the period of continuous operation of the apparatus can be arbitrarily elongated. The size of the lamination device can also be reduced.

An example is given hereinunder, wherein "part" indicates part by weight;

EXAMPLE

Tetrahydrofurfurylmethacrylate. N-n - butoxymethylacrylamide . methylmethacrylate (20/5/75 wt. percent) copolymer — 40 parts
Pentaerythritoltriacrylate — 30 parts
Epoxy resin (ECN-1280, Chiba Co.) — 25 parts
Borontrifluoridemonoethylamine complex — 2.5 parts
Benzophenone — 2.7 parts
Michler's ketone — 0.3 parts
p - methoxyphenol — 0.6 parts
Victoria pure blue - BO — 0.1 parts
Methylethylketone — 120 parts From the foregoing components a photosensitive liquid was produced and was coated on a polyethylene terephthalate film of 25 microns thick by a knife spatulas. The photosensitive material coated film was then dried and a film having a 100 microns thick photosensitive layer was obtained. This film material was further laminated with a 25 microns thick polyethylene film under pressure action thereby finally producing a photosensitive material.

By employing the vacuum laminator shown in FIG. 2, the abovementioned photosensitive material was laminated on a lattice-like circuit plate having metal lines each being 200 microns wide and 20 microns thick arranged with spacing of 200 microns under the condition of 60 mmHg vacuum atmosphere, 80° C laminating temperature and 1 m/min laminating speed.

As a result, the photosensitive layer was laminated onto the panel to perfectly follow the convex-concave surface thereof and no air entrainment was observed. Next, the laminated plate was exposed to light projection through a negative mask to a beam of 9000 μω/cm2 for 2 minutes by employing a 3KW ultra high voltage mercury lamp. Immediately thereafter, the plate was heated at 80° C for 5 minutes and then cooled down. Thereafter, the polyethylene terephthalate film was removed and spray development was applied for two minutes by spraying 1, 1, 1-trichloroetane. Then, the plate was heated at 130° C for 2 hours. As a result, a permanent protective film corresponding to the negative mask in a high precision was obtained and was found to be sufficiently effective as the solder resist.

For the purpose of comparison, the abovementioned photosensitive material was laminated onto the same circuit panel by employing a conventional laminator, (A-24 laminator manufactured by E. I. du Pond de Nemours and Company) under the conditions of atmospheric pressure, 80° C laminating temperature and 1 m/min laminating speed. The laminated plate thus obtained showed a lot of air entrainment, whereby the contact between the photosensitive layer and the plate was not sufficient. The product was found to be unsuitable for the solder resist.

From the foregoing, it will be understood that the method and apparatus of the present invention provide a tight lamination between a filmy photosensitive material and a convex-concave solid surface thereby making it possible to obtain a photo resist for use as a high precision solder resist in an easy process.

Although the invention has been described with respect to an example of laminating a film onto a convex-concave pattern solid surface of a printed wiring board, the invention can also be applied to any purpose of covering a base plate with a film. Therefore, the material of the film may differ according to the purposes of lamination and the present invention is not limited to lamination of a photosensitive layer. For example, the present invention can be applied to laminating a commercially available filmy photosensitive material such as "Riston" produced by E. I. du Pont de Nemours and Company onto a chemically roughtened surface of a copper-coated panel to use as an etching resist. Conventionally, such process has often caused a problem that the photosensitive layer is removed due to insufficient contact to the base solid surface. By employing the present invention, such trouble is effectively avoided. The invention can also be utilized to apply a filmy photosensitive material onto a convex-concaved surface of a solid panel for the purpose of producing a final product which carries a complicated pattern for the display purpose.

Although the continuously operable lamination apparatus of the present invention includes a base plate feed-in port, a laminated plate feed-out port and an optionally provided film feed-in port, the inside space of the apparatus can be effectively evacuated, whereby a film is tightly laminated onto a base plate without entraining air therebetween.

Although the invention has been shown and described with respect to a preferred embodiment, it should be understood by those skilled in the art that various changes and omissions in the form and detail thereof may be made therein without departing from the spirit and the scope of the invention.

We claim:

1. A method of laminating a film onto a base plate comprising:
   evacuating a lamination chamber to at least 200 mm Hg;
   feeding a base plate into said lamination chamber through air tight feed-in rolls;
   supplying a film, from a film supply within the lamination chamber, onto the base plate within said lamination chamber;
   pressing said film onto said base plate within said lamination chamber for laminating the film onto the base plate; and
   feeding the laminated plate from within the lamination chamber through air tight feed-out rolls.

2. The method of claim 1, wherein said film is a filmy photosensitive material.

3. The method of claim 1, wherein said base plate is a printed wiring board.

4. The method of claim 1, wherein said vacuum is lower than 60 mm Hg.

5. A method of laminating a film onto a base plate comprising:
   evacuating a lamination chamber to at least 200 mm Hg;
   feeding a base plate into said lamination chamber through air tight feed-in rolls;
   supplying a film, from a film supply position outside the lamination chamber through at least one set of air tight feed-in rolls, onto the base plate within said lamination chamber;
   pressing said film onto said base plate within said lamination chamber for laminating the film onto the base plate; and
   feeding the laminated plate from within the lamination chamber through air tight feed-out rolls.

6. The method of claim 5, wherein said film is a filmy photosensitive material.

7. The method of claim 5, wherein said base plate is a printed wiring board.

8. The method of claim 5, wherein said vacuum is lower than 60 mm Hg.

9. An apparatus for continuously performing vacuum lamination comprising an evacuation means for evacuating the inside of the apparatus, a film supply means provided at the inside of the apparatus, at least one set of base plate feed-in rolls positioned within the apparatus for feeding a base plate from the outside to the inside of the apparatus, at least one set of press rolls for laminating a film onto the base plate, at least one set of laminated plate feed-out rolls for feeding a laminated plate from the inside to the outside of the apparatus, said base plate feed-in rolls and said laminated plate feed-out rolls being in sliding contact with rubber linings incorporated in a wall structure of the apparatus, and a driving mechanism engaging at least one of said rolls.

10. The apparatus of claim 9, wherein said base plate feed-in rolls and said laminated plate feed-out rolls are provided with rubber linings of 5-30 mm thick and 3-70 Shore A hardness.

11. The apparatus of claim 9, wherein said base plate feed-in rolls and said laminated plate feed-out rolls are provided with rubber linings of 1-60 mm thick and 15 Shore D hardness.

12. An apparatus for continuously performing vacuum lamination comprising an evacuation means for evacuating the inside of the apparatus, at least one set of film feed-in rolls for feeding a film from the outside to the inside of the apparatus, at least one set of base plate feed-in rolls for feeding the base plate from the outside to the inside of the apparatus, at least one set of press rolls positioned within the apparatus for laminating the film onto the base plate, at least one laminated plate feed-out rolls for feeding a laminated plate from the inside to the outside of the apparatus, said film feed-in rolls, said base plate feed-in rolls and said laminated plate feed-out rolls being in sliding contact with rubber linings incorporated in a wall structure of the apparatus, and a driving mechanism engaging at least one of said rolls.

13. The apparatus of claim 12, wherein said film feed-in rolls, said base plate feed-in rolls and said laminated plate feed-out rolls have rubber linings of 5-30 mm thick and 30-70 Shore A hardness.

14. The apparatus of claim 12, wherein said film feed-in rolls, said base plate feed-in rolls and said laminated plate feed-out rolls have rubber linings of 1-60 mm thick and 15 Shore A - 70 Shore D hardness.

* * * * *